United States Patent
Park et al.

(10) Patent No.: US 7,288,947 B2
(45) Date of Patent: Oct. 30, 2007

(54) METHOD FOR SIMULATING RESISTOR CHARACTERISTICS AT HIGH ELECTRIC FIELDS

(75) Inventors: Sangjune Park, Colorado Springs, CO (US); Jay T. Fukumoto, Fort Collins, CO (US); Kenneth J. Paradis, Loveland, CO (US)

(73) Assignee: LSI Corporation, Milpitas, CA (US)

( * ) Notice: Subject to any disclaimer, the term of this patent is extended or adjusted under 35 U.S.C. 154(b) by 128 days.

(21) Appl. No.: 11/316,011

(22) Filed: Dec. 19, 2005

(65) Prior Publication Data

US 2007/0139031 A1 Jun. 21, 2007

(51) Int. Cl.
*G01R 27/08* (2006.01)
*G01R 31/02* (2006.01)

(52) U.S. Cl. .................. 324/713; 324/549
(58) Field of Classification Search .......... 324/549, 324/713, 111, 120, 76.11, 715, 691, 649, 324/600

See application file for complete search history.

(56) References Cited

U.S. PATENT DOCUMENTS

| | | | | |
|---|---|---|---|---|
| 5,294,890 A | * | 3/1994 | Hemminger et al. | 324/549 |
| 5,373,252 A | * | 12/1994 | Naito | 330/288 |
| 5,585,731 A | * | 12/1996 | Tsuchida et al. | 324/537 |
| 5,889,663 A | * | 3/1999 | Tabata et al. | 363/71 |
| 6,242,928 B1 | * | 6/2001 | Honda | 324/713 |

* cited by examiner

*Primary Examiner*—Vincent Q. Nguyen
*Assistant Examiner*—Hoai-An D. Nguyen
(74) *Attorney, Agent, or Firm*—Cochran Freund & Young LLC (57) ABSTRACT

A method for characterizing the current as a function of applied electric field for a resistor exposed to a high electric fields is described. The method uses current versus voltage measurements at low electric fields, where the resistor is not damaged and the current does not saturate. An example illustrating the importance of such resistor characterization is provided.

6 Claims, 7 Drawing Sheets

METHOD FOR SIMULATING RESISTOR CHARACTERISTICS AT HIGH ELECTRIC FIELDS

FIELD OF THE INVENTION

The present invention relates generally to resistors used in integrated circuits and, more particularly, to the simulation of resistor characteristics at high electric fields.

BACKGROUND OF THE INVENTION

Resistors remain an important part of integrated circuits (ICs). However, presently available circuit simulators do not provide significant support for resistors. Since there is no international standard for resistor modeling, IC manufacturers have developed individual resistor models and have included such models into the simulators as modules, sub-circuits or subroutines. The accuracy of such approaches depends on the model itself and upon how well it is matched to measured data. For example, resistors are generally modeled for low electric field (less than $1 \times 10^5$ V/m) applications because of the ease at which such measurements are made, and because low-voltage measurement systems are readily available. For low voltages or electric fields, a commonly used model resistor equation is given by the following:

$$R = R_{SH} \frac{L_{\mathit{eff}}}{W_{\mathit{eff}}} vco \cdot tco, \text{ where}$$

$$vco = \left(1 + VCR1 \cdot \left(\frac{\Delta V}{L_{\mathit{eff}}}\right) + VCR2 \cdot \left(\frac{\Delta V}{L_{\mathit{eff}}}\right)^2\right),$$

$$\text{or } vco = (1 + VCR1 \cdot \Delta V + VCR2 \cdot \Delta V^2), \text{ and}$$

$$tco = (1 + TCR1 \cdot (T - T_{nom}) + TCR2 \cdot (T - T_{nom})^2),$$

where $R_{SH}$ is the Sheet Resistance; $L_{\mathit{eff}}$ is the effective length of the resistor; $W_{\mathit{eff}}$ is the effective width of the resistor; VCR1 is the $1^{st}$-order coefficient for bias effects; VCR2 is the: $2^{nd}$-order coefficient for bias effects; $\Delta V$ is the voltage difference between the high and low terminals of the resistor; TCR1 is the $1^{st}$-order coefficient for temperature effects; TCR2 is the $2^{nd}$-order coefficient for temperature effects; T is the global temperature of the resistor (that is, the junction temperature at thermal equilibrium); $T_{nom}$ is a reference temperature, 25° C. being used for most cases; vco is the voltage coefficient term; and tco is the temperature coefficient term. Note that the second definition provided for vco requires a redefinition of VCR1 and VCR2 as including $1/L_{\mathit{eff}}$ and $(1/L_{\mathit{eff}})^2$, respectively.

Polynomial expressions for both vco and tco have been used for some time because of ease of implementation in the circuit simulator software packages yielding rapid simulation results and mathematical convergence. Variations of these expressions have been used to reflect special situations specific to individual users, but multiplication of a voltage coefficient term, a temperature coefficient term, and a zero-bias resistance term is standard.

Figure 1:
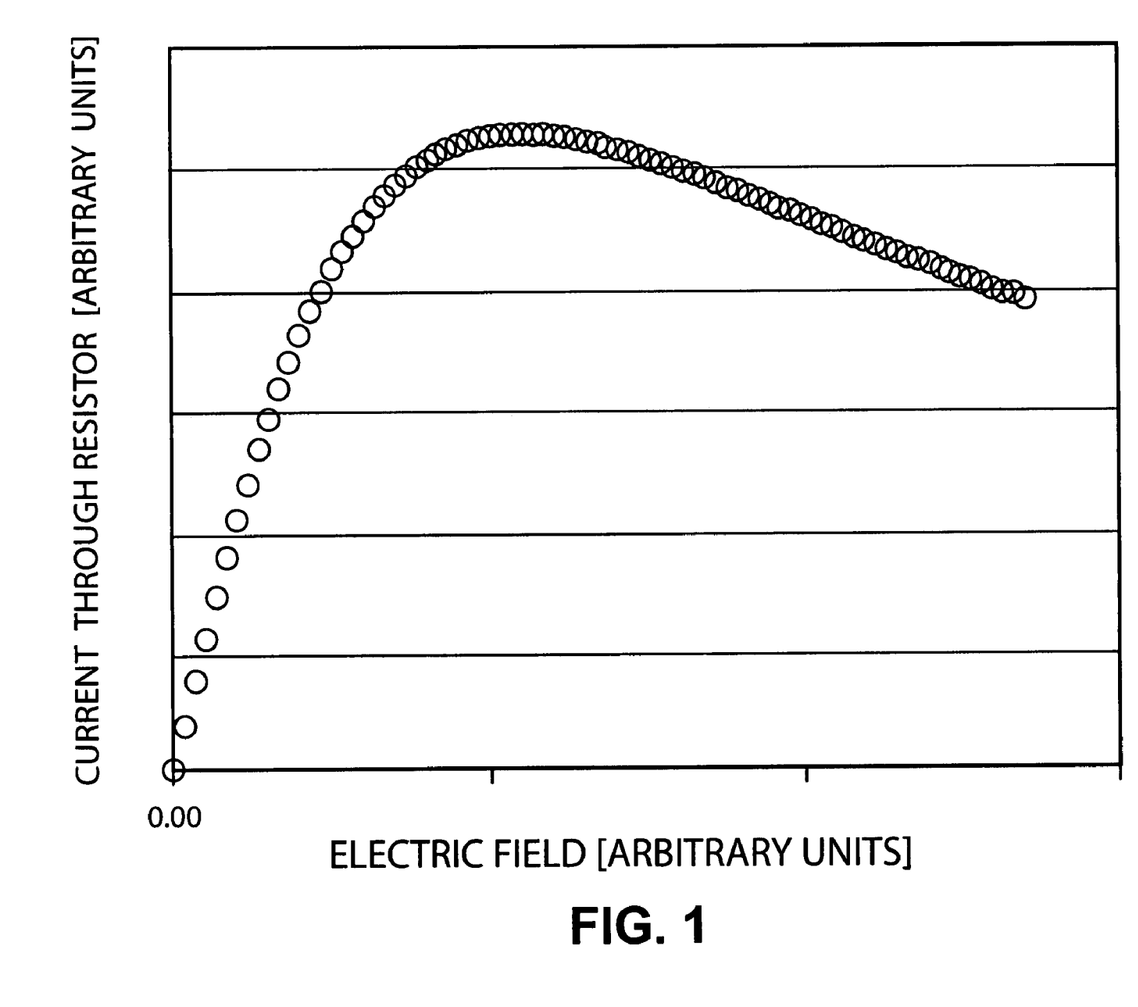
FIG. 1 is a graph of predicted resistor current as a function of applied electric field using the generally used $2^{nd}$-order polynomial voltage coefficient model.

The function of a resistor model is to accurately characterize current as a function of voltage (I-V) applied to the resistor. As may be observed in FIG. 1 hereinbelow, the existing approach for modeling the resistance as a function of $2^{nd}$ order polynomial of bias voltage (or electric field) fails for high electric fields. The conventional polynomial voltage coefficient model does not yield physically meaningful results because it predicts a negative differential resistance characteristic at high electric fields. By contrast, the measured I-V characteristics for a resistor at high electric fields are similar to those of metal oxide field effect transistors in that the current saturates above a certain electric field due to velocity saturation (mobility degradation due to high lateral electric fields) of the carriers. A possible cause of this incorrect prediction may be the use of $2^{nd}$ order polynomial functions since, as the electric field increases, the predicted resistance value is dominated by the square of the electric field, and the observed saturating current behavior is not predicted.

Accordingly, it is an object of the present invention to provide a method for characterizing resistor behavior at high applied electric fields.

Another object of the present invention is to provide a method for characterizing resistor behavior at high applied electric fields using measurements obtained at low applied electric fields.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, the method for characterizing the current (I) response of a resistor experiencing current saturation above a certain applied voltage, as a function of high applied voltages (V), hereof, includes: applying at least two different voltages to the resistor below the current saturation voltage; measuring the current passing through the resistor at each of said at least two different voltages, thereby generating a set of current versus voltage data; calculating the rate of change of current with voltage (dI/dV) as a function of applied voltage; generating a function for fitting 1/(dI/dV) as a function of applied electric field; and integrating the generated function.

Benefits and advantages of the present invention include, but are not limited to, providing a method for characterizing current/voltage (electric field) properties of resistors exposed to high electric fields using current/voltage measurements at low electric field values, thereby protecting the resistor from damage.

BRIEF DESCRIPTION OF THE DRAWING

The accompanying drawings, which are incorporated in and form a part of the specification, illustrate embodiments of the present invention and, together with the description, serve to explain the principles of the invention.

DETAILED DESCRIPTION

Briefly, the present invention includes a method for characterizing resistor behavior in a high electric field environment. Previous modeling procedures use measurements obtained at low electric fields, and a second-order polynomial function of the type set forth hereinabove, for fitting the measured data. The present invention also uses measurements obtained at low dc electric field values, but the model equation is not fixed; rather, it can be modified depending upon the form of the differential resistance ($R_{diff}=dV/dI$). It should be mentioned that pulsed-dc measurements may also be utilized. In most situations, differential resistance has been found to follow a second-order polynomial function, as will be described in greater detail hereinbelow. For an actual resistor, $dV/dI$ for the device of interest is measured as a function of electric field at electric fields (typically less than $1\times10^5$ V/m) which are below those fields which cause current saturation in the resistor, and a function that can be integrated is generated. The range of electric fields employed in accordance with the teachings of the present invention, is similar to that of currently used methods, and below those fields which generate irreparable damage to the resistor. The resistor should be substantially free of self-heating effects; otherwise, the present measurement will produce an over-estimate of the differential resistance, since such effects are not accounted for in the present invention. This may be achieved by choosing resistor dimensions which give rise to larger resistance values. The equation for $dV/dI$ is integrated to yield $R_{eff}(=V/I)$. An analytic function is preferred since none of the currently used circuit simulators support resistor model methodology, and the equations are coded into the circuit simulator as a subcircuit for the well-known circuit simulator HSPICE. Analytic functions also permit faster, converging calculations to be performed.

Figure 2:
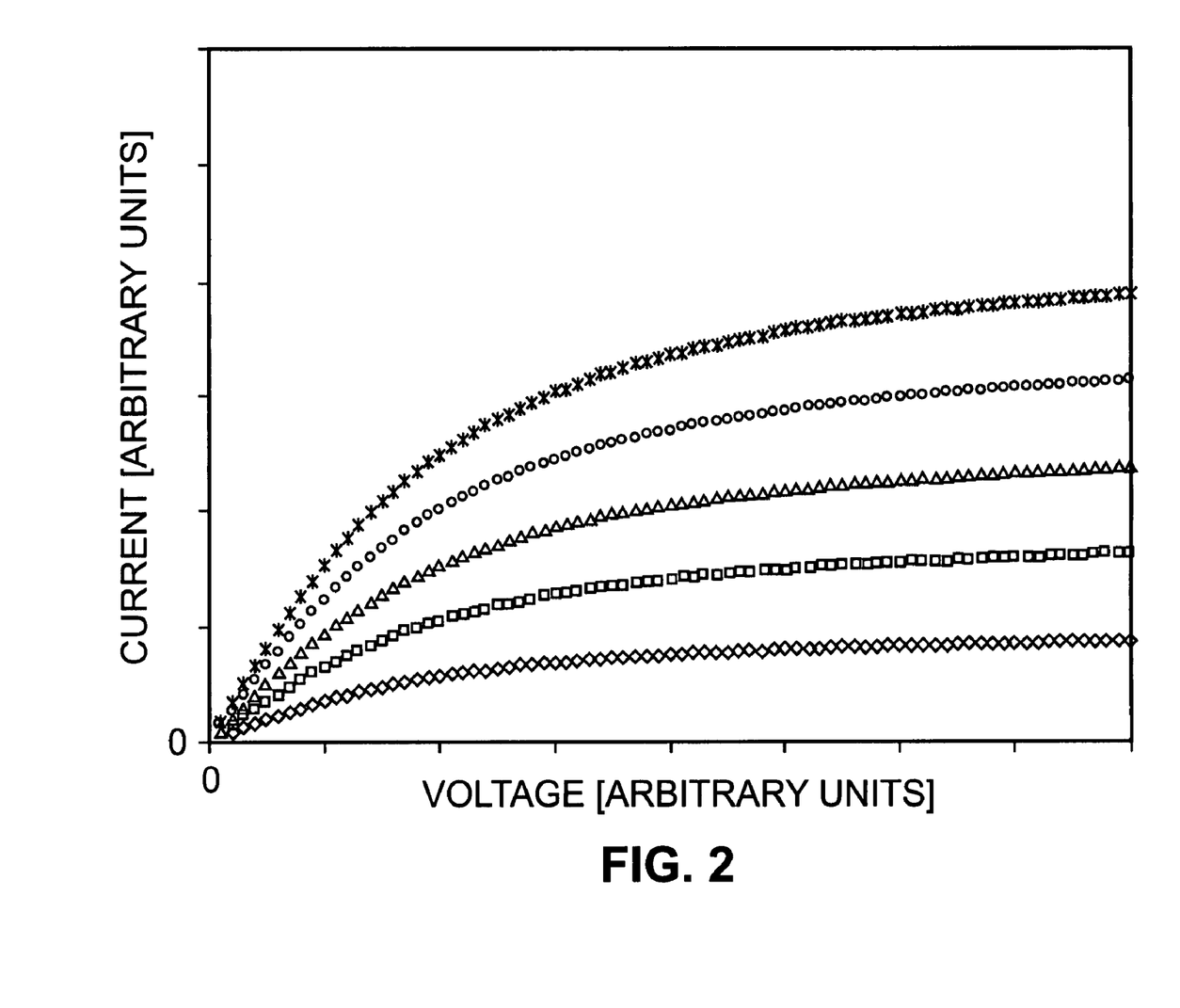
FIG. 2 is a graph of the current as a function of applied voltage for diffusion or poly resistors, the several curves illustrating a current increase at a constant applied voltage for a chosen resistor length, as the width of the resistor is increased, and provides I-V characteristics for resistors from low to high electric field values.

Reference will now be made in detail to the present embodiments of the invention, examples of which are illustrated in the accompanying drawings. Turning now to FIG. 2, a graph of the current as a function of applied dc voltage (I-V) for diffusion or poly resistors is shown, the several curves illustrating a current increase at a particular voltage and resistor length as the width of the resistor is increased. It should be mentioned that the electric field applied to the resistors remains important. For example, although the X-axis of FIG. 2 is labeled as voltage, the electric fields present in the resistors are the same since they have the same length. However, since circuit designers, by convention, are interested in I-V characteristics, voltages are used throughout.

Figure 3:
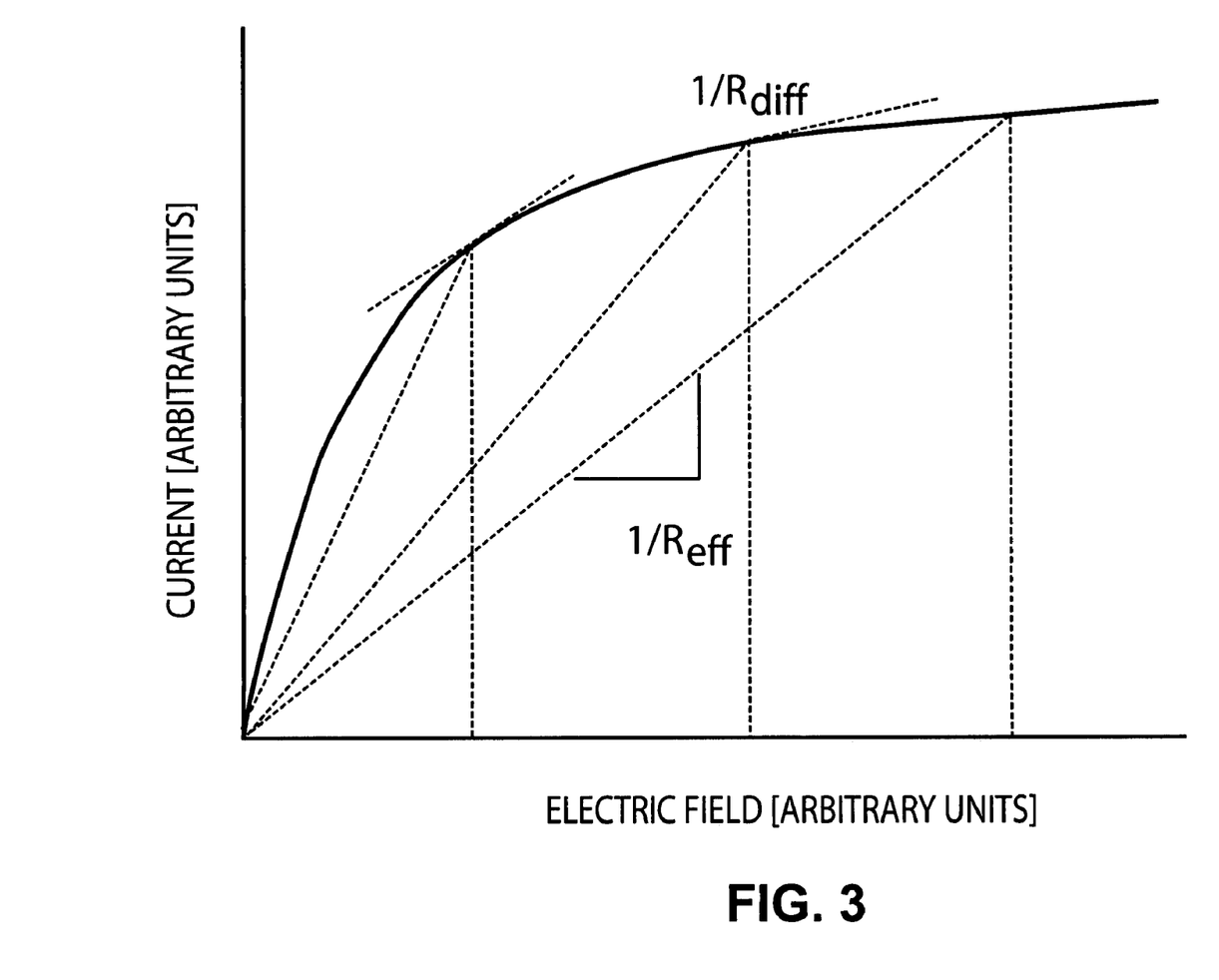
FIG. 3 is a graph showing the general relationship between current and applied electric field for a resistor up to high electric field values.

A general current as a function of applied electric field curve for a resistor up to high electric fields is presented in FIG. 3, from which the definition of $R_{diff}$ as the differential resistance, $dV/dI$ (1/slope of the I-V curve); and the definition of $R_{eff}$ which is the effective resistance (ratio of the voltage to the current (V/I)), may be extracted. From an equation which specifies $R_{eff}$ for each bias voltage, the I-V characteristics of the resistor can be accurately predicted.

Further inspection of FIG. 2 and FIG. 3, suggests that the differential resistance, $dV/dI$, should have a $2^{nd}$-order polynomial dependence on the electric field (voltage). However, if $dV/dI$ is observed to have a different form as a function of voltage or electric field for other types of resistors, the method of the present invention may still be applied so long as the functional form can be integrated.

For the present situation, $dV/dI$ is expressed as:

$$\frac{dV}{dI} = R_{diff} = R_0\left[1 + \frac{vcr1}{L}\delta V + \frac{vcr2}{L^2}\delta V^2\right], \quad \text{Equ. 1}$$

where $R_0$ is the resistance at zero-bias (low electric field) at a chosen reference temperature, L is the effective length of the resistor, $\delta V$ is the voltage applied between the two nodes of the resistor, and vcr1 and vcr2 are temperature independent constants to be determined. The temperature chosen does not matter as long as the same temperature is used for a reference temperature in the temperature coefficient model. As a convention, however, 25° C. is chosen for bias modeling.

Figure 4:
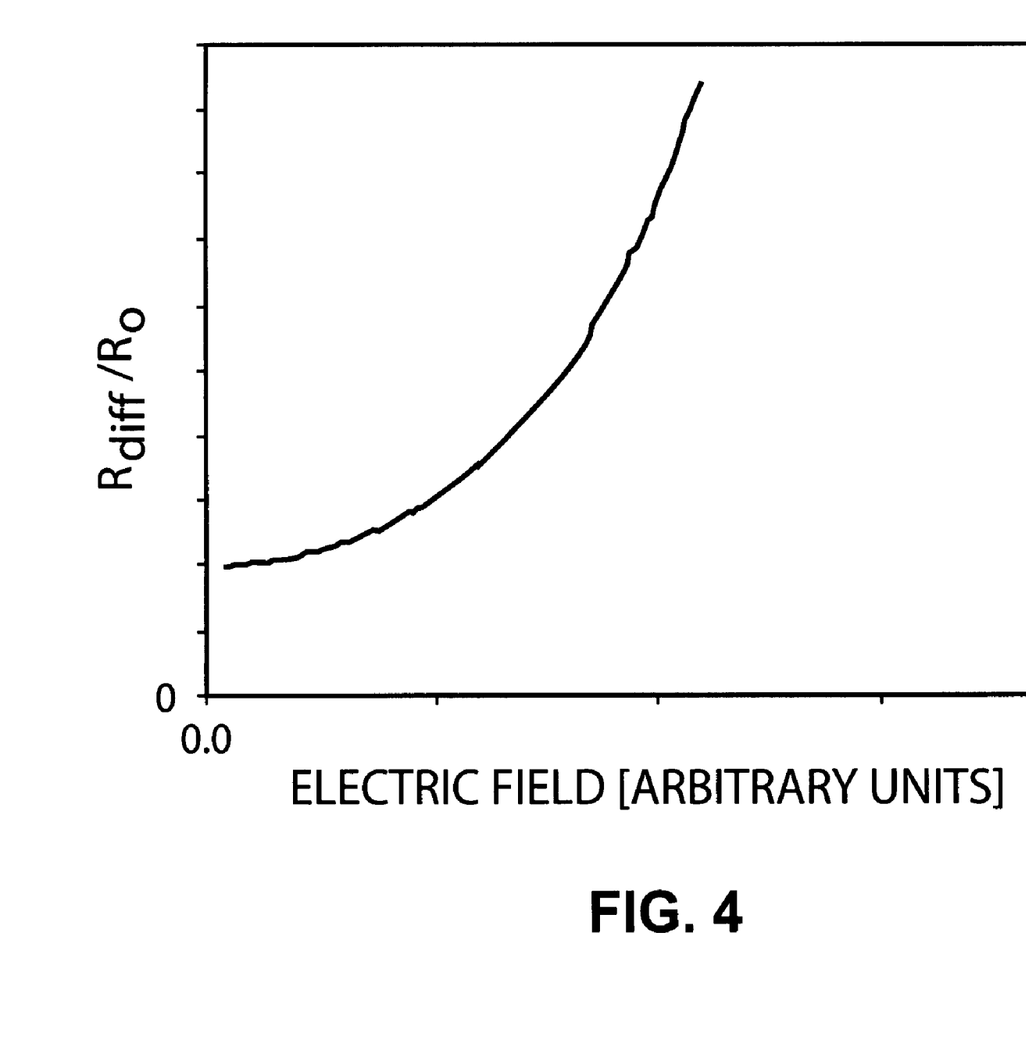
FIG. 4 is a graph of $R_{diff}/R_0$ as a function of electric field.

FIG. 4 is a graph of $R_{diff}/R_0$ as a function of electric field. From Equ. 1, the effective resistance, $R_{eff}$, can be derived as follows:

$$R_{diff} = R_0\left[1 + \frac{vcr1}{L}\delta V + \frac{vcr2}{L^2}\delta V^2\right]$$

$$dI = \frac{1}{R_{diff}}dV$$

$$\int_{I=0}^{I=I}dI = \int_{V=0}^{V=\delta V}\frac{dV}{R_{diff}} = \frac{1}{R_0}\int_{V=0}^{V=\delta V}\frac{dV}{1+\frac{vcr1}{L}V+\frac{vcr2}{L^2}V^2},$$

from which $$R_{eff} = \frac{1}{2}\frac{\delta V \cdot R_0 \cdot \sqrt{4ac-b^2}}{\tan^{-1}\frac{2a\delta V+b}{\sqrt{4ac-b^2}}-\tan^{-1}\frac{b}{\sqrt{4ac-b^2}}}, \text{where}$$

$$a = \frac{vcr2}{L^2}, b = \frac{vcr1}{L}, c = 1.$$

Since it is the voltage difference that generates current flow, $\delta V$ appears in the equations rather than V which is shown as an integration parameter and may be associated with the current. $v_{CR1}$ and $V_{CR2}$ are determined by fitting $R_{diff}$. That is, once the functional form of $R_{diff}$ is known, all of the parameters may be calculated. It should be mentioned that $R_{diff}$ is fitted to the low voltage data rather than $R_{eff}$, since the functional form of $R_{eff}$ is not necessarily known when a resistor is being modeled. Moreover, it is easier to fit a second-order polynomial to data than a complex trigonometric function.

Figure 5:
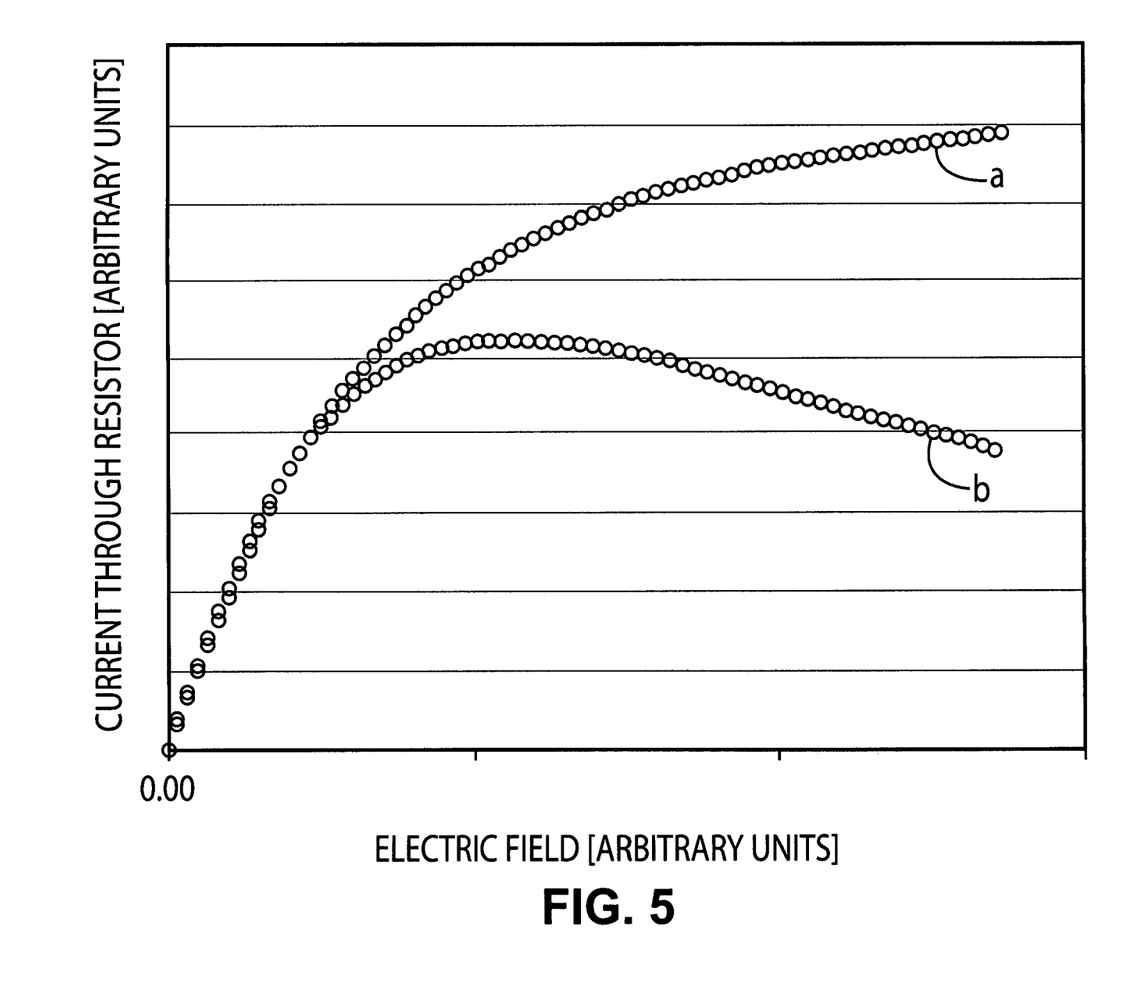
FIG. 5 is a graph illustrating a comparison of the calculated current as a function of applied electric field generated in accordance with the method of the present invention (Curve a), compared with the generally used $2^{nd}$-order polynomial voltage coefficient model (Curve b).

FIG. 5 is a graph illustrating a comparison of the calculated current as a function of electric field characteristics generated in accordance with the method of the present invention (Curve a) compared with the currently used $2^{nd}$ order polynomial voltage coefficient model (Curve b). As may be observed, both methods give approximately the same results for low electric fields. However, for high electric field values, the method of the present invention produces physically realistic I-V characteristics. In addition to the improved I-V curve shape, I-V simulation using the present method agrees well with measured data.

In summary, the present invention models resistors at high electric fields using integration of differential resistance values ($R_{diff}$=dV/dI), which yield I-V curves having superior accuracy up to the material breakdown electric field condition. By contrast, the conventional modeling methodology uses low electric field measurement data for model optimization, but uses a second-order polynomial function to fit the measurement data. However, for high electric field applications this model generates negative differential resistance characteristics which do not represent actual observations. Although the present invention uses the low electric field measurement data, the model equation is not fixed. It can be changed depending upon what form the differential resistance follows. In most cases, the differential resistance follows a second-order polynomial function. Thus, for many situations the present invention can be applied by simply fitting the voltage coefficient parameters.

Having generally described the present method, the use thereof is described in the following EXAMPLE.

EXAMPLE

Figure 6:
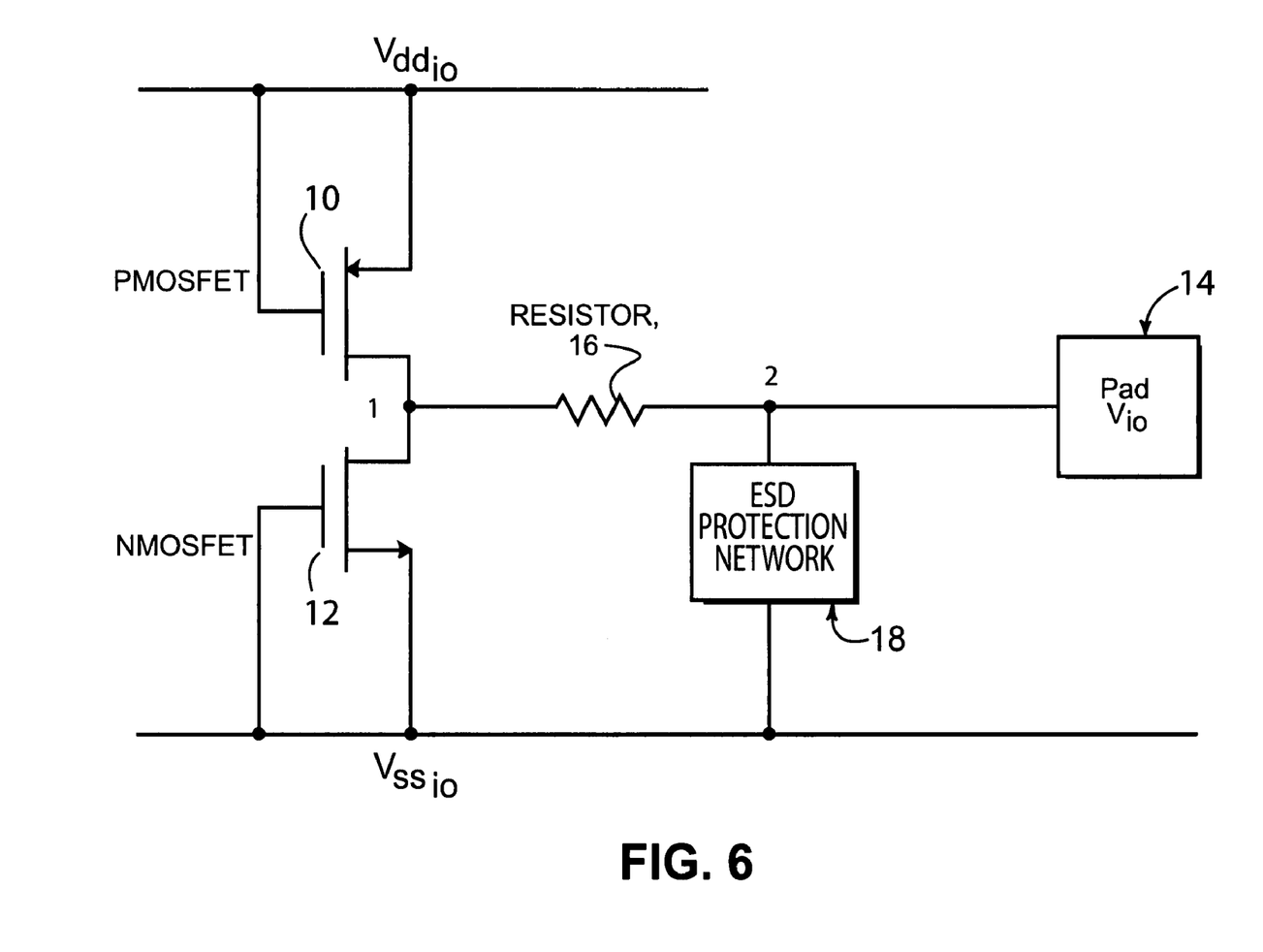
FIG. 6 illustrates the use of an ESD protection circuit in electrical contact with a resistor which may be exposed to high electric fields.

An application where electrostatic discharge (ESD) protection is desired for sensitive circuitry is described. FIG. 6 illustrates the use of an ESD protection circuit in electrical contact with a resistor which may be exposed to high electric fields. This combination establishes contact between sensitive electrical components and the real world. The output from a complementary metal oxide semiconductor (CMOS) having PMOSFET, 10, and NMOSFET, 12, in contact with an application (PAD $V_{io}$), 14, through the resistor of interest, 16, is protected by ESD protection circuit, 18. In order to design the ESD protection network connected to node 2, the maximum amount of current the CMOS circuit can safely experience must be determined, along with the consequent voltage at node 1. Resistor 16 is connected between node 1 and node 2 in order to limit the current flowing from Pad 14 into the internal circuitry. This gives rise to the high voltage at node 2 which triggers the ESD protection network. It is the saturation of the I-V characteristics of resistors at high electric fields described hereinabove that is utilized to limit the current flowing into the sensitive circuitry and increase the voltage at the node where ESD protection network is connected. Thus, in order to design appropriate ESD protection circuitry using this approach, voltage and current characteristics across the resistor used must be predicted.

Figure 7:
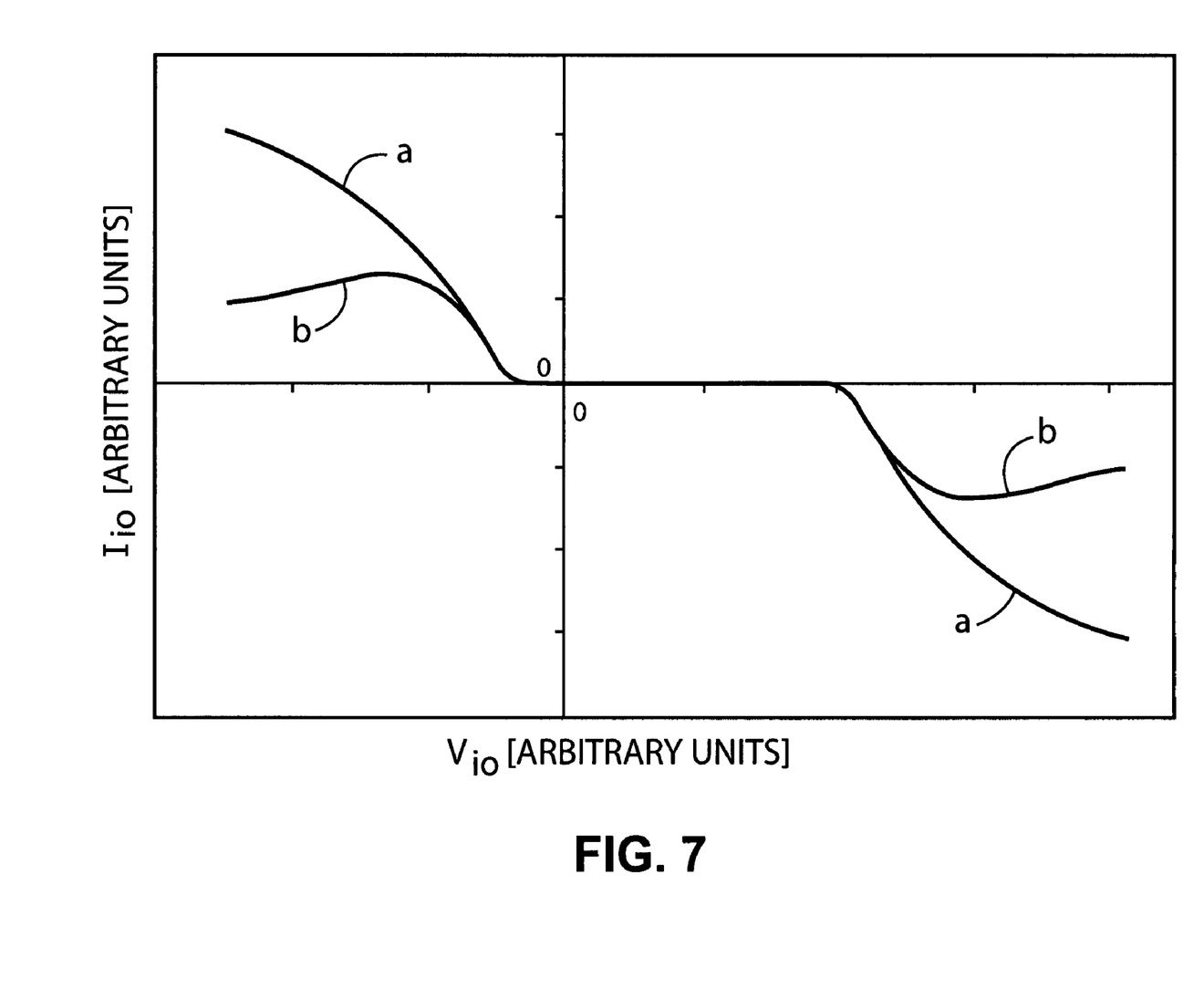
FIG. 7 shows the current at node 2 of the apparatus described in FIG. 6 hereof as a function of voltage on that node when the resistor of interest is characterized in accordance with the teachings of the present invention, while Curve b is generated using conventional $2^{nd}$-order polynomial resistor model methodology.

The following is the example of I-V simulation of the circuitry in FIG. 6. Using this simulation result, designer can determine what voltage or current the ESD protection circuit will be designed for. FIG. 7, Curve a, shows the current at node 2 as a function of voltage of that node when resistor 16 is characterized in accordance with the teachings of the present invention. Curve b, by contrast is generated using the convention resistor model methodology. The conventional model does not yield physically meaningful results, since as discussed hereinabove, there are no resistors having smaller current flow at higher voltages.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for characterizing the current (I) response of a resistor experiencing current saturation above a certain applied voltage, as a function of high applied voltages (V), comprising the steps of:
   applying at least two different voltages to the resistor below the current saturation voltage;
   measuring the current passing through the resistor at each of said at least two different voltages, thereby generating a set of current versus voltage data;
   calculating the rate of change of current with voltage (dI/dV) as a function of applied voltage from the set of current versus voltage data;
   generating a function for fitting 1/(dI/dV) as a function of applied voltage; and
   integrating the generated function as a function of applied voltage.

2. The method of claim 1, wherein said step of applying at least two different voltages to the resistor comprises applying at least two dc voltages to the resistor.

3. The method of claim 1, wherein the function comprises an analytic function.

4. The method of claim 3, wherein the function is given by $$\frac{dV}{dI} = R_0 \left[ 1 + \frac{vcr1}{L} \delta V + \frac{vcr2}{L^2} \delta V^2 \right],$$

where $R_0$ is the resistance at substantially zero-bias voltage at chosen reference temperature, L is the effective length of the resistor, vcr1 and vcr2 are temperature independent constants to be determined, and $\delta V$ is the voltage difference applied across the resistor.

5. The method of claim 1, wherein the chosen reference temperature is 25° C.

6. The method of claim 4, wherein the integrated form of the function is given by:

$$R_{eff} = \frac{1}{2} \frac{\delta V \cdot R_0 \cdot \sqrt{4ac - b^2}}{\tan^{-1} \frac{2a\delta V + b}{\sqrt{4ac - b^2}} - \tan^{-1} \frac{b}{\sqrt{4ac - b^2}}}, \text{ where}$$

$$a = \frac{vcr2}{L^2}, b = \frac{vcr1}{L}, c = 1.$$

* * * * *